United States Patent
Nazari et al.

(10) Patent No.: US 6,526,530 B1
(45) Date of Patent: Feb. 25, 2003

(54) METHOD AND APPARATUS FOR ENCODING DATA INCORPORATING CHECK BITS AND MAXIMUM TRANSITION RUN CONSTRAINT

(75) Inventors: Nersi Nazari, Cupertino, CA (US); Andrei Vityaev, Santa Clara, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/470,170

(22) Filed: Dec. 22, 1999

(51) Int. Cl.[7] .............................................. G06F 11/00
(52) U.S. Cl. ........................................ 714/701; 714/758
(58) Field of Search ................................ 714/771, 800, 714/801, 701, 799, 805, 809, 758; 341/58, 59

(56) References Cited

U.S. PATENT DOCUMENTS

| | | | | |
|---|---|---|---|---|
| 5,748,649 A | * | 5/1998 | Michel et al. .............. 714/771 |
| 5,859,601 A | | 1/1999 | Moon et al. ................... 341/59 |
| 6,018,304 A | * | 1/2000 | Bessios ........................ 341/58 |
| 6,243,847 B1 | * | 6/2001 | McClellan et al. .......... 714/800 |
| 6,282,690 B1 | * | 8/2001 | McClellan et al. .......... 714/801 |
| 6,388,587 B1 | * | 5/2002 | Brickner et al. .............. 341/59 |

\* cited by examiner

*Primary Examiner*—David Ton
(74) *Attorney, Agent, or Firm*—Eric B. Janofsky

(57) ABSTRACT

Method and apparatus for encoding data using check bits for additional data protection, in addition to the time-varying maximum transition run code which eliminates data patterns producing long runs of consecutive transitions. The check bits are inserted into codewords in preselected locations. The time-varying maximum transition run code does not permit more than j transitions beginning from an even-numbered sample period and does not permit more than j+1 transitions beginning from an odd-numbered sample period, wherein j>1. This time-varying maximum transition run constraint is preserved even after the check bits are inserted, regardless of the bit values of the check bits.

16 Claims, 3 Drawing Sheets

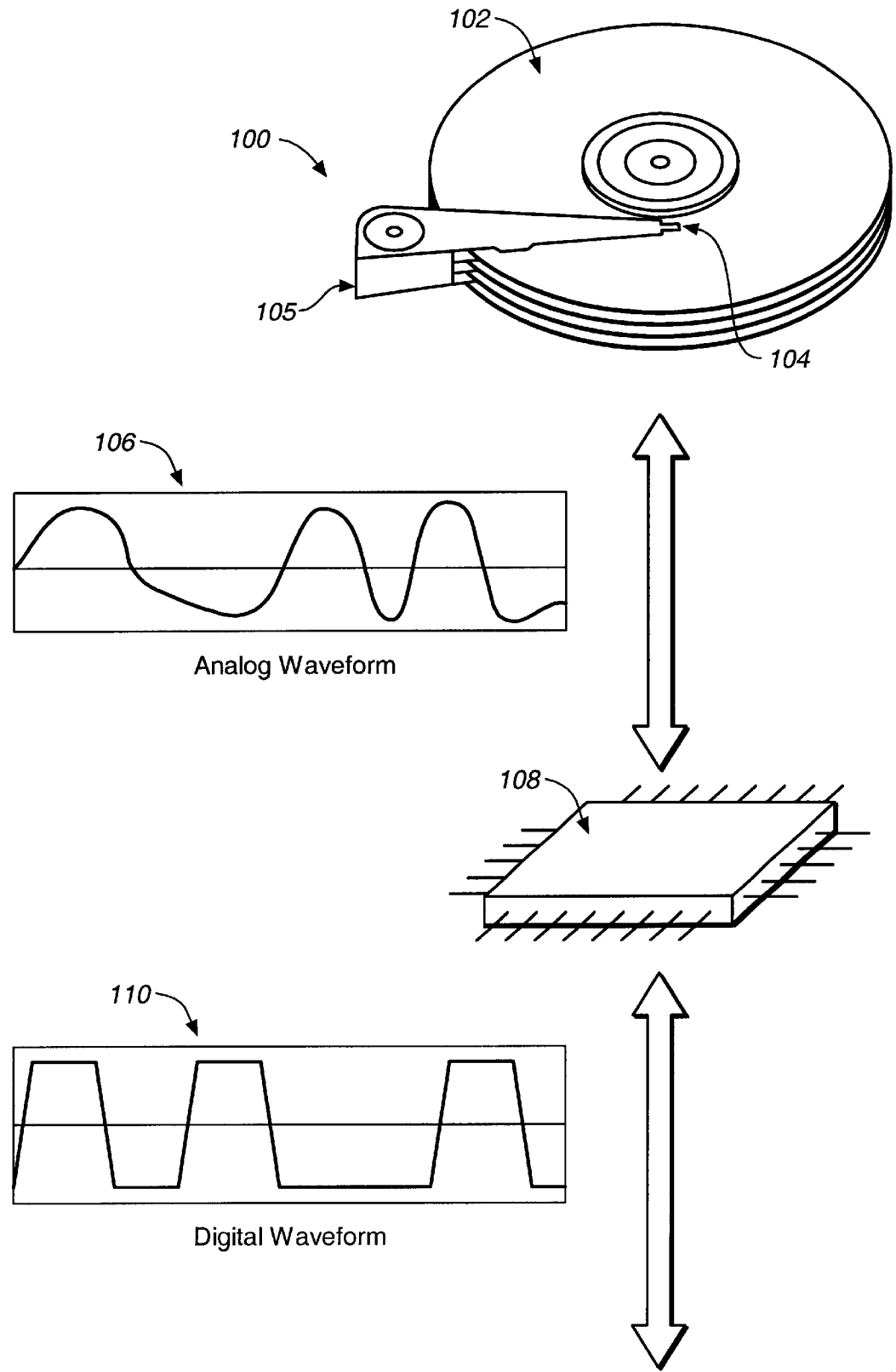
FIG._1

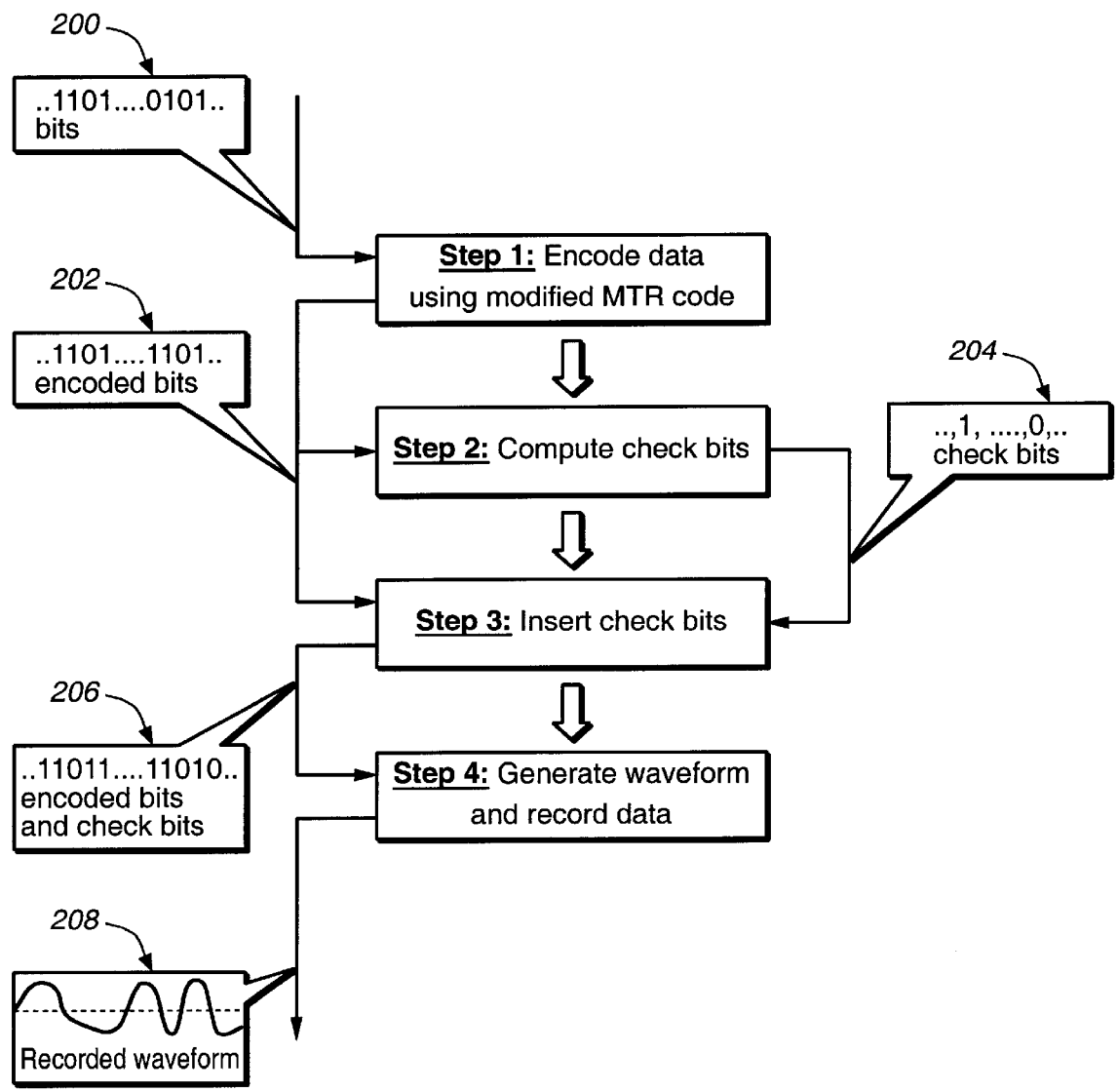
FIG._2

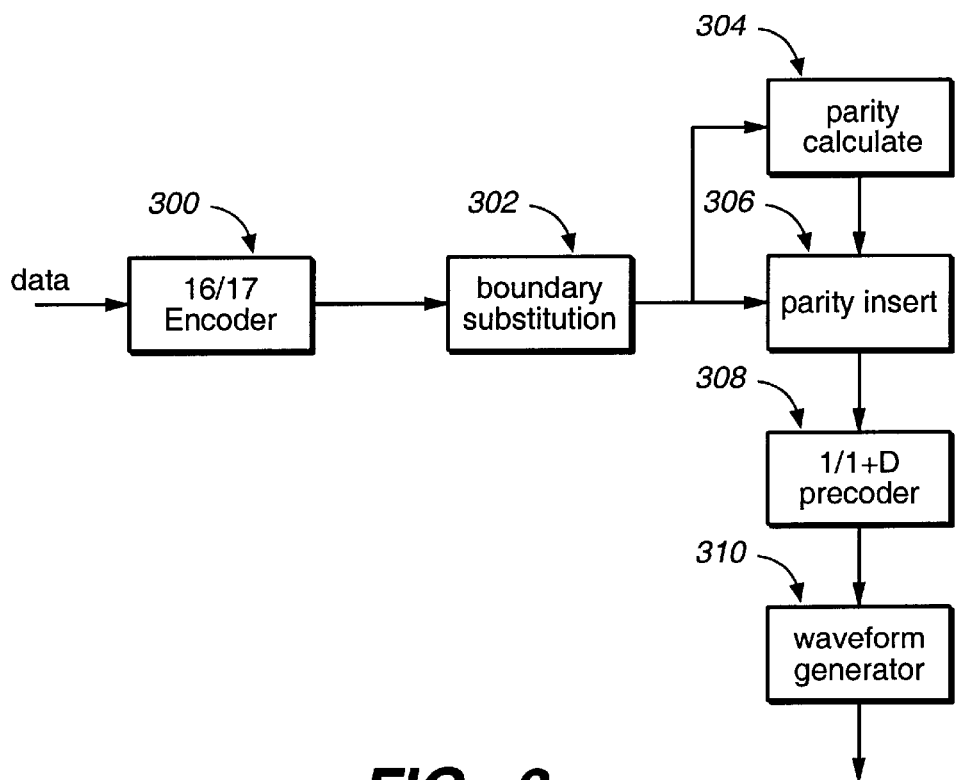
FIG._3
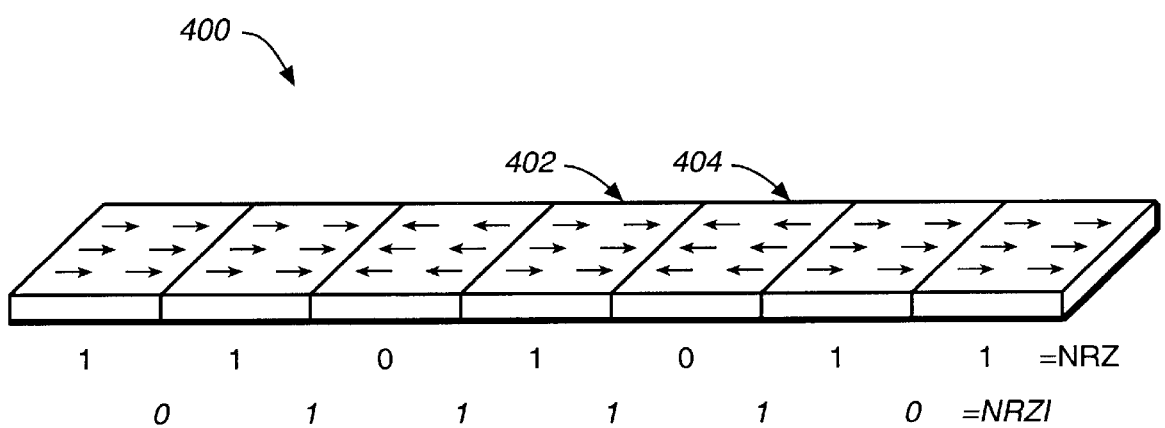
FIG._4

METHOD AND APPARATUS FOR ENCODING DATA INCORPORATING CHECK BITS AND MAXIMUM TRANSITION RUN CONSTRAINT

FIELD OF THE INVENTION

The present invention relates in general to digital storage systems, and more specifically to an improved data encoding technique using check bits and time varying maximum transition run constraint for additional data protection.

BACKGROUND OF THE INVENTION

In a digital data storage system, a device called "Read-Channel" integrated circuit is usually incorporated between the data input/output and the storage medium. In an example of a magnetic disc drive, as illustrated in FIG. 1, during a write process, the Read-Channel integrated circuit 108 encodes the input sequence of binary data, in the form of digital waveform 110, into another sequence of binary data, and uses the latter to generate a write current which is then sent to the head-disc assembly 100, which contains several magnetic discs 102 and several magnetic heads 104 on a moving arm 105. As the magnetic head 104 glides above the surface of the magnetic discs, the magnetic field orientations on the surface of one of the magnetic discs 102 are changed according to the write current as the mechanism for writing the data to a non-volatile magnetic storage medium.

During a read process, the magnetic heads 104 react to the changes in the orientation of the magnetic field on the magnetic discs 102 and produces an electric signal of constantly varying amplitude. This electrical signal is then pre-amplified using appropriate circuitry and the resulting analog waveform 106 is sent to the Read-Channel integrated circuit 108. The Read-Channel integrated circuit 108 processes the analog waveform 106 and outputs the data in a digital waveform 110.

Therefore the recorded waveform (transitions in the orientation of the magnetic field on the magnetic disc) is not generated from the input data directly but from an encoded representation of the data. It is possible then to design different encoding schemes in which the recorded waveform of the encoded data has a variety of desirable properties such as robustness against partial erasure of magnetic transitions.

One way to protect data stored in a storage system is to add check bits which do not carry information but which can be used to identify and, in some cases, correct errors in the information bits. One example would be to add a parity bit at the end of each block of m bits. The parity bit can be chosen to guarantee that the total number of 1's in the codeword of m bits is even. If during write and read processes, an error occurs in one bit, the parity sum will be odd as an indication that there is an error somewhere among the block of m bits. Depending on the number of check bits inserted, where the check bits are inserted and how the check bits are calculated, the scheme of inserting check bits to protect data stored in a storage system can cover a wide range of error events. One drawback of this scheme, however, is that it only identifies, or sometimes, corrects data after an error has occurred, and does not prevent certain errors from occurring.

One way to prevent certain errors from occurring is to exclude certain error prone code patterns from being used. For example, the number of consecutive transitions in the encoded waveform can be limited. Two different formats of writing data in a storage system include the Non-Return-to-Zero (NRZ) format and the Non-Return-to-Zero-Inverse (NRZI) format. In a magnetic disc drive, the NRZ value of a bit can be 0 or 1 depending on the magnetic field direction of the bit cell on the magnetic disc. Sometimes, it is more convenient to write data in NRZI format, in which 1 corresponds to a polarity change between two neighboring bit cells and 0 corresponds to no polarity change. Shown in FIG. 4 is a schematic drawing of a track 400 of data on a magnetic disc, containing bit cells 402, 404, etc. The NRZ and NRZI sequences corresponding to the track of data are also shown. FIG. 4 illustrates an undesirable situation in a magnetic disc drive, where multiple consecutive transitions in a row, or equivalently, multiple consecutive 1's in the NRZI sequence of bits, are present. Such data sequences are very susceptible to partial erasure effect when the magnetic field of a bit cell interferes with nearby bit cells. Such interference may change the magnetic field directions of the bit cells, partially erasing the magnetic transitions on the media and weakening the output signal of a magnetic head as it flies over these cells.

One solution to this problem, as disclosed in U.S. Pat. No. 5,859,601, is to limit the number of consecutive 1's in the NRZI data sequence. The data encoding process which achieves that is called Maximum Transition Run (MTR) code. In many cases it is preferable to use a time-varying version of MTR code instead of straight MTR code. For example, one can allow at most three consecutive 1's starting from an odd-numbered NRZI bit and at most two consecutive 1's starting from an even-numbered NRZI bit, and achieve the performance on par with the more constrained non-time-varying MTR code. See, for example, K. Fitzpatrick, C. Modlin "*Time-Varying MTR Codes for High Density Magnetic Recording*" Proceeding of the Global Conference on Communications, Phoenix, Ariz., 1997.

The problem of multiple consecutive transitions of magnetic field directions in a row of bits on a magnetic disc can be avoided by encoding the input data using time-varying MTR code and therefore errors associated with this problem can be prevented from occurring. However, the types of errors that can be prevented by the MTR code or the time-varying MTR code is limited. It would be desirable to identify or correct other types of errors which the MTR code does not prevent.

SUMMARY OF THE INVENTION

In accordance with the present invention, an improved coding technique combines the two approaches (inserting check bits and imposing time-varying MTR constraint). The check bits are inserted to identify and correct common types of errors not covered by the time-varying MTR code.

In one embodiment of the invention, as illustrated by the flowchart in FIG. 2, the method of imposing time-varying MTR and inserting check bits is implemented by several steps. In step 1, the data bits 200 are first encoded using a modified time-varying MTR encoder. The encoder assures that at most j consecutive transitions occur beginning from an even numbered position in the encoded data sequence and at most j+1 consecutive transitions occur beginning from an odd numbered position. Here j is a pre-selected integer greater than or equal to 2. In addition, Step 1 assures that the encoded data sequence 202 will satisfy the time-varying MTR constraint, and the other conditions, even when the check bits are inserted into the sequence later on. This can be achieved by imposing more restrictive time-varying MTR constraints near the pre-selected bit locations where the check bits are to be inserted. Depending on the embodiments, features can be added to the modified time-varying MTR encoder to assure that the encoded data satisfy other desirable conditions.

In step 2, the encoded bits 202 are used to compute check bits 204 (e.g. parity bits). In Step 3 the check bits are inserted into the encoded data. The resulting sequence 206 is used in Step 4 to generate the waveform for recording the data.

BRIEF DESCRIPTION OF THE DRAWINGS

FIG. 1 depicts a magnetic disc drive system and illustrates the inputs and outputs of the Read-Channel integrated circuit 108;

FIG. 2 is a flowchart illustrating one embodiment of the method of the invention;

FIG. 3 is a block diagram of the hardware architecture according to one embodiment of the invention; and FIG. 4 is a pictorial illustration of a track of data in a magnetic disc drive and the corresponding NRZ and NRZI sequences of bits.

DESCRIPTION OF THE PREFERRED EMBODIMENT

One embodiment of the present invention is illustrated in FIG. 3. The data is divided into chunks 16 bits long. Each 16-bit dataword is mapped into a 17-bit codeword using a rate 16/17 encoder 300. Since the number of possible 17-bit words is larger than the number of possible 16-bit words, the encoder 300 can be designed to map the 16-bit datawords into a chosen set of 17-bit codewords that satisfy the modified MTR constraint. After the data is encoded, the sequence of the 17 bit codewords is checked for a variety of conditions applying to the boundaries between the codewords. If such conditions are violated, substitutions are applied in block 302 to the respective boundaries. The 17-bit words are then grouped in pairs. In each of the resulting 34 bit words two parity bits are computed in block 304, and inserted in block 306, in the middle of each of the two 17-long words comprising the 34 bit word. The resulting codeword has 36 bits which contain 32 bits of information. The output of block 306 is in the NRZI domain and it is sent to block 308 where 1/1+D precoding is performed to convert the sequence to NRZ domain. The NRZ bits are then sent to the waveform generator 310.

A more detailed description of each of the blocks in FIG. 3 follows.

1. 16/17 Encoder

The function of the 16/17 encoder 300 in FIG. 3 is to map a 16-bit dataword into a 17-bit codeword which satisfies the modified time-varying MTR constraint even after the insertion of a parity bit later on, regardless of the value of the parity bit. Therefore, the location in each 17-bit codeword where the parity bit will be inserted must be selected before the data is encoded. In this embodiment, a parity bit is inserted in the middle of each 17-bit codeword. More specifically, in this embodiment, once the 16-bit data words have been mapped into the 17-bit code words and the boundary substitutions 302 are done, the 17-bit code words are grouped into pairs. Each pair is a chunk of 34 bits (containing two 17-bit words) which can be denote d(1), ..., d(34). These 34 s are then assigned to the bits of a 36-bit codeword b(1), ..., b(36) according to the following:

$$b(i)=d(i) \text{ for } i=1, \ldots, 8$$
$$b(i+1)=d(i) \text{ for } i=9, \ldots, 25 \quad (1)$$
$$b(i+2)=d(i) \text{ for } i=26, \ldots, 34$$

So b(9) and b(27) in the 36-bit code word are left to be filled with parity information. The 16/17 encoder 300 assures that for each 17-bit codeword, after the insertion of a parity bit, the resulting 18-bit codeword will satisfy the time-varying MTR and other constraints regardless of the value of the parity bit.

To describe the 16/17 code it is sufficient to describe the constraint of the set of 17-bit codewords into which the 16-bit datawords are mapped. One skilled in the art can then design a method to map between 16-bit words and the chosen set of 17-bit words, which satisfy the constraint, in order to implement the code. Each of the 17-bit codewords is required to satisfy the following conditions:

(a) After a parity bit is inserted, regardless of the value (0 or 1) of the parity bit, the resulting 18-bit codeword has at most four consecutive 1's beginning from an odd-numbered bit, where the first bit in every codeword is considered odd;

(b) After a parity bit is inserted, regardless of the value (0 or 1) of the parity bit, the resulting 18-bit codeword has at most three consecutive 1's beginning from an even-numbered bit;

(c) After a parity bit is inserted, regardless of the value (0 or 1) of the parity bit, the resulting 18-bit codeword has at most eight consecutive zeros in a row beginning from either end;

(d) After a parity bit is inserted, regardless of the value (0 or 1) of the parity bit, the resulting 18-bit codeword has at most eleven consecutive zeros anywhere in the codeword;

(e) After a parity bit is inserted, regardless of the value (0 or 1) of the inserted parity bit, after the resulting 18-bit codeword is passed through a 1+D precode decoder 308, the minimum number of 1's in the codeword is four;

(f) The 17-bit codeword can begin with at most three 1's;

(g) The 17-bit codeword can end with at most two 1's;

(h) After a parity bit is inserted, regardless of the value (0 or 1) of the inserted parity bit, if the binary complement of the resulting 18-bit codeword satisfies conditions (a) and (b), the 18-bit codeword can not have a consecutive run of 16 bits in pairs.

Conditions (a) and (b) represent the time-varying Maximum Transition Run (MTR) constraint. Other conditions are features added to avoid other problems, and can be designed differently depending on the applications. In this embodiment, conditions (c) and (d) aid timing recovery by limiting the maximum length of an interval without any transitions from which timing information is derived. Condition (e) is also used to aid timing as well as gain recovery. This condition is often referred to as Minimum Hamming Weight Constraint. Conditions (f) and (g) together with substitution rules which are described later herein assure that MTR constraints (a) and (b) are satisfied at the boundary of codewords.

Finally, condition (h) addresses the issue of Quasi-Catastrophic (QC) sequences. In NRZI domain a QC sequence is a long consecutive run of bits in pairs (e.g. 110000111100 . . . ). A code word containing a QC sequence can get mistaken for its binary compliment during a read or write process. In this embodiment, a codeword is avoided, if the binary Compliment of the codeword is also a possible codeword, and if the codeword has a consecutive run of 16 bits in pairs. For example, codewords such as the following are disallowed:

x1100110p00110011x; 11001100p0110000xx;
xx110011p011000011

Here 'x' stands for any NRZI bit and 'p' stands for parity bit. When enforcing this constraint, it is enough to check for words containing QC sequences among words whose binary complements satisfy the MTR constraints (a) and (b) and are therefore possible codewords.

Out of a total number $2^{17}$=31072 of 17-bit code words, 68202 of them satisfy the rules (a) through (h), which are the modified time-varying MTR constraint. This number, 68202, is greater than the total number $2^{16}$=65536 of sixteen bit data words, therefore permitting design rate 16/17 code in accordance with the aforementioned constraints.

2. Boundary Check and Substitution

After the 16/17 encoder has mapped the 16-bit datawords into the 17-bit codewords satisfying conditions (a) through (h,) as recited in the previous section, the 17-bit codewords are joined together and the boundaries between codewords are checked for violations of the MTR constraint and for other undesirable situations. If a violation is found, boundary substitution 302 is done to eliminate the problem. Possible situations of violation and the associated substitution rules are discussed in the following.

Due to conditions (f) and (g) it is possible to have a codeword ending with two ones to be followed by a codeword beginning with three ones. We denote such situation by:

... 11,111 ...

where comma indicates the codeword boundary. Here we have five consecutive ones beginning from the $17^{th}$ bit (after the insertion of the check bit) of a codeword. This boundary condition will violate condition (a) and therefore has to be substituted for. Another undesirable situation is:

... 1,111 ...

involving four consecutive 1's beginning from the last bit (i.e. $18^{th}$ bit after the insertion of the check bit) of the previous codeword. Condition (b) is thus violated. Whenever these two boundary conditions are found, the substitution rules shown in Table 1 are applied.

TABLE 1

First set of boundary substitution rules

... 0011,11100 ... → ... 0111,00000 ...
... 0011,11101 ... → ... 0111,00001 ...
... 1011,11100 ... → ... 0111,00010 ...
... 1011,11101 ... → ... 0111,00101 ...
... 0001,11100 ... → ... 0111,00110 ...
... 0001,11101 ... → ... 0111,01001 ...
... 0101,11100 ... → ... 0111,01010 ...
... 0101,11101 ... → ... 0111,01101 ...
... 1001,11100 ... → ... 1000,11110 ...
... 1001,11101 ... → ... 1010,11110 ...
... 1101,11100 ... → ... 1100,11110 ...
... 1101,11101 ... → ... 0110,11110 ...

Also, condition (c) allows to have a consecutive rnm of sixteen 0's spanning across two code words. To eliminate this problem, two substitution rules as shown in Table 2 are introduced. These two rules, together with conditions (c) and (d), will assure that the produced sequence of bits satisfies the k=11 constraint, meaning that the sequence of codewords can have at most 11 zeros in a row.

TABLE 2

Second set of boundary substitution rules

... 0000,00001 ... → ... 0010,11110 ...
... 0000,00000 ... → ... 0100,11110 ...

Finally, condition (h) allows to have a 30 bit long QC sequence spanning across two codewords. To eliminate this problem, a set of substitution rules as shown in Table 3 are applied. This set of substitution rules together with condition (h) guarantee that the longest run of a QC sequence is limited to 20 bits in pairs.

TABLE 3

Third set of boundary substitution rules

... 000011,00001 ... → ... 001111,01101 ...
... 110011,00001 ... → ... 101111,01101 ...
... 110000,11000 ... → ... 101111,01110 ...
... 110000,11001 ... → ... 101111,00101 ...
... 100110,01100 ... → ... 001111,01110 ...
... 000110,01100 ... → ... 001111,00110 ...
... 001100,11000 ... → ... 001111,01010 ...
... 001100,11001 ... → ... 001111,00101 ...
... 111100,11000 ... → ... 101111,00110 ...
... 111100,11001 ... → ... 101111,01001 ...
... 000011,11000 ... → ... 001111,00010 ...
... 000011,11001 ... → ... 001111,01001 ...
... 110011,11000 ... → ... 101111,01010 ...
... 110011,11001 ... → ... 101111,00001 ...
... 001100,00110 ... → ... 001111,01100 ...
... 001100,00111 ... → ... 001111,00111 ...
... 111100,00110 ... → ... 101111,00010 ...
... 111100,00111 ... → ... 101111,00111 ...
... 000011,00110 ... → ... 001111,00100 ...
... 000011,00111 ... → ... 001111,01011 ...
... 111001,10011 ... → ... 101111,01011 ...
... 011001,10011 ... → ... 001111,00011 ...
... 110011,00110 ... → ... 101111,01100 ...
... 110011,00111 ... → ... 101111,00011 ...

3. Parity Calculation and Insertion.

After the boundary substitution 302 is done by applying the rules in Tables 1, 2 and 3, the output sequence of code words is framed into 34-bit blocks, each containing two 17-bit code words. Two parity bits are calculated 304 and inserted 306 per each 34-bit block of code words. The 34 data bits d(1), ..., d(34) of each 34 bit block are assign to the bits in a 36-long codeword as follows:

$b(i)=d(i)$ for $i=1$ ..., 8

$b(i+1)=d(i)$ for $i=9$, ..., 25

$b(i+2)=d(i)$ for $i=26$ ..., 34

This leaves b(9) and b(27) to be filled with parity information. In this embodiment, a parity bit is inserted after the first eight bits of the first 17-bit codeword and after the first eight bits of the second 17-bit codeword in a 34 bit block. In order to calculate the parity bits, b(9) and b(27), the following two sums modulo 2 are first calculated:

$S_1=b(1)+b(3)+b(5)+b(7)+b(11)+b(13)+b(15)+b(17)+b(19)+b(21)+b(23)+b(25)+b(29)+b(31)+b(33)+b(35)$ (Eq. 1)

$S_2=b(1)+b(2)+b(5)+b(6)+b(10)+b(13)+b(14)+b(17)+b(18)+b(21)+b(22)+b(25)+b(26)+b(29)+b(30)+b(33)+b(34)$ (Eq. 2)

and b(9) and b(27) are set according to the following $b(9)=S_2, b(27)=b(9)+S_1$ (Eq. 3)

By doing so the following two equations are satisfied:

$b(1)+b(2)+b(5)+b(6)+b(9)+b(10)+b(13)+b(14)+b(17)+b(18)+b(21)+b(22)+b(25)+b(26)+b(29)+b(30)+b(33)+b(34)=0 \pmod{2}$ (Eq. 4)

$b(1)+b(3)+b(5)+b(7)+b(9)+b(11)+b(13)+b(15)+b(17)+b(19)+(21)+b(23)+b(25)+b(27)+b(29)+b(31)+b(33)+b(35)=0 \pmod{2}$ (Eq. 5)

4. Performance Analysis via Error Events

Included here is a brief discussion regarding the performance of this embodiment of the invention. The performance is analyzed by determining which error events, during the processes of writing and reading data from the media, can be prevented or corrected. In addition to the error events which are prevented by the modified time-varying MTR constraint, the encoding method constructed by the aforementioned embodiment of the invention facilitates correction of the dominant error events in NRZ domain as listed in Table 4A.

TABLE 4A

Dominant error events in NRZ domain.

(+1)
(+1,−1)
(+1,−1,+1)
(+1,0,0,+1)

In Table 4A, event (+1,−1,+1) denotes the situation when data sequence 010 is mistaken for 101 or vice versa. Event (+1,0,0,+1) denotes the situation when data sequence 0000 is mistaken for 1001 or when 0100 is mistaken for 1101 and so on. In NRZI domain, where parity bits are computed and inserted in this embodiment, these error events are expressed in Table 4B. In Table 4B, 'x' stands for NRZI bit error and '0' stands for no error.

TABLE 4B

Dominant error events in NRZI domain.

xx
x0x
x00x
xx0xx

It is easy to see that if an 'xx' error event occurs inside of a 36-bit code word, equation (3) will not hold. Therefore this error can be detected and corrected in conventional manner. In a similar way one can verify that the other three error events in Table 4B will cause either Equation (4) or (5) or both of these equations to fail, regardless of whether the error event occurs within a codeword or across the boundary of two code words.

What is claimed is:

1. A method for encoding n-bit binary datawords into m-bit binary code words in a recorded waveform, where n and m are pre-selected positive integers such that m is greater than n, the method comprising:

(a) receiving the n-bit binary data words;

(b) producing a sequence of (m-p)-bit code words, where p is a pre-selected positive integer such that (m-p)>n;

(c) inserting p check bits into each (m-p)-bit code word in the sequence of (m-p)-bit code words to produce a sequence of m-bit code words;

(d) generating no more than j consecutive transitions beginning from an even-numbered sample period of the sequence of m-bit code words in the recorded waveform, where j>1 and where the first sample period of an m-bit codeword is odd; and (e) generating no more than j+1 consecutive transitions beginning from an odd-numbered sample period of the sequence of m-bit codewords in the recorded waveform, (f) wherein the sequence of (m-p)-bit codewords is produced by producing one (m-p)-bit codeword in response to each n-bit dataword sequentially, each (m-p)-bit codeword selected from $2^{(m-p)}$ possible (m-p)-bit codewords in accordance with a set of conditions including (f1) after the insertion of p parity bits into the (m-p) bit codeword, regardless of the value of each of the p parity bits, the resulting m-bit codeword has no more than j consecutive ones beginning from an even numbered bit of the (m-p)-bit codeword, where the first bit in a codeword is regarded as odd; and (f2) after the insertion of p parity bits into the (m-p) bit codeword, regardless of the value of each of the p parity bits, the resulting m-bit codeword has no more than j+1 consecutive ones beginning from an odd numbered bit, (g) wherein after the insertion of p parity bits into the (m-p) bit codeword, regardless of the value of each of the p parity bits, the resulting m-bit codeword has consecutive zeros in a row beginning from either end, such that x>0;

(h) wherein after the insertion of p parity bits into the (m-p) bit codeword, regardless of the value of each of the p parity bits, the resulting m-bit codeword has at most y consecutive zeros anywhere in the (m-p) bit codeword, such that y>x; and (i) wherein after the insertion of p parity bits into the (m-p) bit codeword, regardless of the value of each of the p parity bits, the resulting m-bit codeword is 1+D precode decoded such the that the minimum number of 1's in the m-bit codeword is z, such that z>0.

2. The method as in claim 1, wherein x=8, y=11 and z=4.

3. The method as in claim 1 wherein the consecutive transition limit j is 3.

4. The method as in claim 1 wherein the length of the dataword n is 16.

5. The method as in claim 1, wherein the length of the n-bit data word n is 16, the length of the m-bit code word mn is 18, the number of parity bit per code word p is 1, the consecutive transition limit j is 3, and a 17-bit codeword is produced in response to each 16-bit dataword sequentially, each 17-bit codeword selected from $2^{17}$ possible 17-bit codewords in accordance with a set of conditions including:

after the one parity bit is inserted into a 17 bit codeword, regardless of the value of the parity bit, the resulting 18-bit codeword having no more than 3 consecutive transitions beginning from an even-numbered sample period of the 17-bit dataword;

after the one parity bit is inserted into a 17 bit code word, regardless of the value of the parity bit, the resulting 18-bit codeword having no more than 4 consecutive transitions beginning from an odd-numbered sample period of the 17 bit data word; after the one parity bit is inserted, regardless of the value of the parity bit, the resulting 18-bit code-word having no more than eight consecutive bits without a transition beginning from either end of the 18-bit codeword;

after the one parity bit is inserted, regardless of the value of the parity bit, the resulting 18-bit code word having no more than eleven consecutive bits without a transition anywhere in the 18-bit codeword;

after the one parity bit is inserted, regardless of the value of the parity bit, the minimum number of bits with NRZ values of 1 in the 18-bit codeword is four.

6. The method as in claim 1, further comprising substituting bits in the sequence of (m-p)-bit codewords near boundary of two (m-p)-bit codewords where there are more than j consecutive transitions beginning from an even-numbered sample period of one of the two (m-p)-bit codewords and spanning across the boundary of the two (m-p)-bit codewords in the sequence of (m-p)-bit codewords in the recorded waveform.

7. The method as in claim 1, further comprising substituting bits in the sequence of (m-p) codewords near boundary of two (m-p)-bit codewords where there are more than j+1 consecutive transitions beginning from an odd-numbered sample period of one of the two (m-p)-bit codewords and spanning across the boundary of the two (m-p)-bit codewords in the sequence of (m-p)-bit codewords in the recorded waveform.

8. The method as in claim 1, wherein the length of the n-bit data word n is 16, the length of the m-bit code word m is 18, the number of parity bit per code word p is 1, the consecutive transition limit j is 3, and inserting one check bit into each 17-bit codeword in the sequence of 17-bit codewords to produce a sequence of 18-bit codewords include grouping the sequence of 17-bit codewords in pairs, producing a sequence of 34-bit codewords, each 34-bit codeword containing two consecutive 17-bit codewords in the sequence of 17-bit code-words;

mapping each 34-bit codeword in the sequence of 34-bit codewords into a 36-bit codeword, in accordance with the following equations:

$b(i)=d(i)$ for $i=1, \ldots, 8$ $b(i+1)=d(i)$ for $i=9, \ldots, 25$ $b(i+2)=d(i)$ for $i=26, \ldots, 34$ where b(i) is the bit value of the $i^{th}$ bit of 36-bit codeword, and using the bits d(i) in the 34-bit codeword to calculate the values of the parity bits b(9), b(17).

9. Apparatus for encoding n-bit binary datawords into m-bit binary codewords in a recordable waveform, where n and m are preselected positive integers such that m is greater than n, the apparatus comprising:

a receiver for receiving the n-bit binary datawords;

an encoder coupled to the receiver, for producing a sequence of (m-p)-bit codewords, where p is a preselected positive integer such that (m-p)>n;

means for inserting p check bits into each (m-p)-bit code word in the sequence of (m-p)-bit code words to produce a sequence of m-bit codewords;

the sequence of m-bit codewords generating no more than j consecutive transitions beginning from an even-numbered sample period of the sequence of m-bit code words in the recorded waveform, where j>1; and the sequence of m-bit codewords generating no more than j+1 consecutive transitions beginning from an odd-numbered sample period of the sequence of m-bit codewords in the recorded waveform, wherein the encoder produces the sequence of (m-p)-bit codewords by producing one (m-p)-bit codeword in response to each n-bit dataword sequentially, each (m-p)-bit codeword selected from $2^{(m-p)}$ possible (m-p)-bit codewords in accordance with a set of conditions including after the insertion of p parity bits into the (m-p) bit codeword, regardless of the value of each of the p parity bits, the resulting m-bit codeword has no more than j consecutive transitions beginning from an even numbered bit, where the first bit in a codeword is considered odd; and after the insertion of p parity bits into the (m-p) bit codeword, regardless of the value of each of the p parity bits, the resulting m-bit codeword has no more than j+1 consecutive transitions beginning from an odd numbered bit.

wherein after the insertion of p parity bits into the (m-p) bit codeword, regardless of the value of each of the p parity bits, the resulting m-bit codeword has consecutive zeros in a row beginning from either end, such that x>0;

wherein after the insertion of p parity bits into the (m-p) bit codeword, regardless of the value of each of the p parity bits, the resulting m-bit codeword has at most y consecutive zeros anywhere in the (m-p) bit codeword, such that y>x; and wherein after the insertion of p parity bits into the (m-p) bit codeword, regardless of the value of each of the p parity bits, the resulting m-bit codeword is 1+D precode decoded such the that the minimum number of 1's in the m-bit codeword is z, such that z>0.

10. The apparatus as in claim 9, wherein x=8, y=11 and z=4.

11. The apparatus as in claim 9 wherein the consecutive transition limit j is 3.

12. The apparatus as in claim 9 wherein the length of the dataword n is 16.

13. The apparatus as in claim 9, wherein the length of the n-bit data word n is 16, the length of the m-bit code word m is 18, the number of parity bit per code word p is 1, the consecutive transition limit j is 3, and the decoder produces a 17-bit codeword in response to each 16-bit dataword sequentially, each 17-bit codeword selected from $2^{17}$ possible 17-bit codewords in accordance with a set of conditions including:

after the one parity bit is inserted into a 17 bit code word, regardless of the value of the parity bit, the resulting 18-bit code word having no more than 3 consecutive ones beginning from an even-numbered bit of the 17 bit data word;

after the one parity bit is inserted into a 17 bit code word, regardless of the value of the parity bit, the resulting 18-bit code word having no more than 4 consecutive ones for the beginning from an odd-numbered bit of the 17 bit data word;

after the one parity bit is inserted, regardless of the value of the parity bit, the resulting 18-bit code word having no more than eight consecutive bits.without a transition beginning from either end of the 18-bit codeword; and after the one parity bit is inserted, regardless of the value of the parity bit, the resulting 18-bit code word having no more than eleven consecutive bits without a transition anywhere in the 18-bit codeword;

after the one parity bit is inserted, regardless of the value of the parity bit, the minimum number of bits with NRZ values of 1 in the 18-bit codeword is four.

14. The apparatus as in claim 13, further comprising means coupled to the encoder for substituting bits in the sequence of (m-p)-bit codewords near boundary of two (m-p)-bit codewords where there are more than j consecutive ones beginning from an even-numbered bit of one of the two (m-p)-bit codewords and spanning across the boundary of the two (m-p)-bit codewords in the recorded waveform.

15. The apparatus as in claim 9, further comprising means coupled to the encoder for substituting bits of the (m-p) codewords near boundary of two (m-p)-bit codewords where there are more than j+1 consecutive ones beginning from an odd-numbered bit of one of the two (m-p)-bit codewords and spanning across the boundary of the two (m-p)-bit codewords in the recorded waveform.

16. The apparatus as in claim 9, wherein the length of the n-bit data word n is 16, the length of the m-bit code word m is 18, the number of parity bit per code word p is 1, the consecutive transition limit j is 3, and the means for inserting one check bit into each 17-bit codeword in the sequence of 17-bit codewords to produce a 18-bit codeword include means for grouping the sequence of 17-bit codewords in pairs, producing a sequence of 34-bit codewords, each 34-bit codeword containing two consecutive 17-bit codewords in the sequence of 17-bit code-words;

means operable on the bits d(i) in the 34-bit codeword to calculate the values of the parity bits b(9), b(17).

* * * * *